(12) United States Patent
Zenner et al.

(10) Patent No.: US 6,246,010 B1
(45) Date of Patent: Jun. 12, 2001

(54) HIGH DENSITY ELECTRONIC PACKAGE

(75) Inventors: Robert L. D. Zenner, Minneapolis; Joel Arthur Gerber, St. Paul; Kevin Yu Chen, Eagan, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/199,693

(22) Filed: Nov. 25, 1998

(51) Int. Cl.[7] .............................. H05K 1/16; H05K 1/14; H05K 1/11
(52) U.S. Cl. ................ 174/260; 174/254; 174/255; 361/749; 257/723; 257/724
(58) Field of Search .................. 174/254, 255, 174/260, 52.1, 52.2, 52.3, 52.4; 361/783, 760, 749, 750, 751; 257/723, 725, 777

(56) References Cited

U.S. PATENT DOCUMENTS

| | | |
|---|---|---|
| 5,143,785 | 9/1992 | Pujol et al. . |
| 5,432,677 * | 7/1995 | Mowatt et al. .................. 361/719 |
| 5,601,678 * | 2/1997 | Gerber et al. .................. 156/150 |
| 5,620,795 | 4/1997 | Haak et al. . |
| 5,727,310 * | 3/1998 | Casson et al. ................... 29/830 |
| 5,768,109 * | 6/1998 | Gulick et al. ................... 361/794 |
| 5,805,424 * | 9/1998 | Purinton ......................... 361/760 |
| 5,854,740 * | 12/1998 | Cha ................................. 361/760 |
| 5,907,477 * | 5/1999 | Tuttle et al. ..................... 361/760 |
| 5,969,945 * | 10/1999 | Cutting et al. .................. 361/704 |
| 6,051,877 * | 4/2000 | Usami et al. .................... 257/679 |

FOREIGN PATENT DOCUMENTS

| | | | |
|---|---|---|---|
| 0 521 735 A1 | 1/1992 | (EP) | ............................ H05K/3/36 |
| 0 526 133 A2 | 2/1992 | (EP) | ............................ H05K/3/46 |
| 0 632 685 A2 | 1/1994 | (EP) | ............................ H05K/7/20 |
| WO 98/02921 | 1/1998 | (WO) | ......................... H01L/23/538 |

OTHER PUBLICATIONS

Zenner, Proceedings International Conference on Electronic Assembly, IPC Northbrook, IL, May, 1996, vol. 2, IPC–TP–1111 pp. 1–14.

* cited by examiner

Primary Examiner—Jeffrey Gaffin
Assistant Examiner—I. B. Patel
(74) Attorney, Agent, or Firm—Matthew B. McNutt (57) ABSTRACT

The present invention is an ultra-thin circuit package with a thinned electronic device having a thickness of less than about 100 $\mu m$; a flexible circuit substrate; and an adhesive layer with a thickness of less than about 25 $\mu m$ between the electronic device and the circuit substrate. The circuit package is less than about 275 $\mu m$ thick. In another embodiment, the circuit packages may be stacked on one another and laminated together to create an extremely high-density three-dimensional electronic circuit package.

7 Claims, 5 Drawing Sheets

— ■ — Initial Resistance
— ▲ — 125°C x 1000hrs
— ♦ — -40°C – 125°C x 1000hrs
— ♦ — 85°C/85%rh x 1000hrs

Fig. 5B

— ■ — Initial Resistance
— ▲ — 125°C x 1000hrs
— ● — -40°C – 125°C x 1000hrs
— ♦ — 85°C/85%rh x 1000hrs

HIGH DENSITY ELECTRONIC PACKAGE

BACKGROUND OF THE INVENTION

1. Field of the Invention

The present invention relates to ultra-thin, high performance, and extreme high-density electronic packages. More particularly, the present invention uses chip thinning, adhesive bonding, and laminated microelectronic interconnect technology to provide a circuit package with extremely low thickness dimensions. These thin circuit packages can be stacked vertically to create a three dimensional electronic package with the highest possible functionality per volume.

2. Description of Related Art

Chip thinning has been available in rudimentary form for many years. Backside grinding to the range of 100–200 $\mu$m silicon thickness is commonly employed where high heat transfer or low profiles are required. The minimum thickness is 100 $\mu$m in order to avoid chip damage. For silicon thickness of 50 $\mu$m and below the chip shows some flexibility that increases as the thickness decreases.

Adhesive flip-chip bonding has been used with success in applications such as chip-on-glass for flat panel displays, chip-on-flex, and for high-end multi-chip modules. See, for example, Zenner, *Proceedings International Conference on Electronic Assembly*, IPC Northbrook, Ill., May, 1996, Vol. 2, IPC-TP-1111 pp. 1–14. The bond-line between pads using adhesive flip-chip can be as low as several microns. For bumped chip bonds the height of the gold bump largely determines the bond-line thickness. Added particles determine the bond-line thickness with unbumped chips and these are usually in the range of 5–10 microns. Bumped chip bonding methods involve a relatively simple task of compressing the bump into the circuit pad to make a reliable connection. Reliable bonding methods for unbumped thin chips demand greater care to insure that the conductive particles are indeed trapped between the contact pads and that excess particles do not bridge to a nearby pad location.

Laminated microelectronic interconnect flex circuitry is designed to enable multiple layers of 25 $\mu$m thick flex circuitry to be used to prepare densely routed, flexible circuits with actual thickness of about 50 $\mu$m/layer. See, for example U.S. Pat. No. 5,601,678 to Gerber et al. Interlayer vias are included which have a total diameter of only 4 mils (100 $\mu$m) with capture pads having 6 mils (150 $\mu$m) diameter. Typical vias prepared by drilling and plating require capture pad diameter of at least 16 mils (400 $\mu$m). Thus this laminated flex can enable routing much finer than conventional laminate circuits. Flip-chip attachment will generally require very fine pitch at the inner lead region due to the fine pad pitch (about 200 $\mu$m) and high pad count found on many integrated circuit chips. Flip-chip bonding of multiple chips on laminate flex is only possible because the lines can escape through to the lower routing layer owing to this small via size.

Commonly used techniques for flip-chip interconnect required bonding with reflowed solder ball bumps at each bonding site on the chip. Typically, these solder ball bumps have a stand-off height of more than 100 $\mu$m. Another common attachment technique for bare integrated circuit chips is wire bonding of face-up surface mounted chips. The wire loops up and out from the pad give an effective height again on the order of 100 $\mu$m. These wires are usually protected by adding glob-top curable pastes that add still more height to each chip bond. While both of these bare chip bonding methods could conceivably be performed using thin chips (501 $\mu$m or less silicon thickness) they remain handicapped by the stand-off limits of greater than 100 $\mu$m in height that will prevent the production of an ultra-thin package.

SUMMARY OF THE INVENTION

This invention employs chip thinning, adhesive flip-chip bonding, and laminated microelectronic interconnect technology to provide a flexible electronic circuit package. One embodiment of the invention, a two-dimensional multi-chip circuit package made of a thinned chip bonded to a flexible circuit substrate, offers the distinct advantages of minimized total volume and continued functionality even if exposed to bending forces. One embodiment of this circuit package includes a thinned bare semiconductor device with a thickness of less than about 100 $\mu$m, a flexible circuit substrate with a conductive circuit trace thereon, and an adhesive layer with a thickness of less than about 25 $\mu$m between the bare semiconductor device and the circuit substrate. The semiconductor device is electrically connected to the circuit traces during the bonding procedure. The circuit package is less than about 275 $\mu$m thick and retains its flexibility after assembly.

In another embodiment of the present invention, the circuit packages may be stacked on one another and laminated together to create an extremely high-density three-dimensional electronic circuit package. The laminated circuit packages are electrically interconnected to one another and the electronic package remains flexible after assembly.

The circuit package of the present invention has the advantage of reduced stress due to its overall thinness. The flexibility of the silicon increases as the thickness decreases. After cool-down from bonding temperature, the thermal expansion mismatch among the flexible circuit substrate, adhesive, and thinned bare semiconductor device leads to tensile stresses at the substrate surface and along the edge of the adhesive (near the interconnect pads on the semiconductor device). Thermal mismatch also contributes to compressive stress on the surface of the semiconductor device. Delamination or cracks in the adhesive can arise in a package with full silicon thickness that retains the stress. These flaws can propagate through the interconnect pads leading to failure of the device. This stress is overcome in the flexible circuit structure of the present invention as the tensile force imparts a slight curvature to the package. A low or no stress adhesive flip-chip of this type bond will have substantially reduced tendency to fail.

The thin adhesive layer bond-line also allows for improvement in mechanical and thermal properties of the circuit package of the present invention. The very thin adhesive layer will be able to tolerate the relaxation curvature described above. A thicker adhesive layer would not. Thin adhesive would further reduce the effects of thermal expansion on thermal excursions. Finally, the short thermal path through the adhesive is expected to be efficient in spite of the relatively poor thermal conductivity of these materials after cure.

Very thin electronic packaging can enable new device technologies. The circuit structures of the present invention enable high silicon packaging density to provide increased data storage capacity in small area, such as, for example, in an aircraft cockpit. The electronic circuit structures of the present invention may also enable development of completely new electronic system formats. A flexible circuit structure may enable production of an electronic device that conforms to non-planar surfaces. For example, in the garment industry a manufacturer could embed a simple radio frequency addressable identification circuit within a seam or beneath a logo patch that verifies the article as an authentic product. This could be used to combat fraudulent merchandise. The flexible circuit would be required to function regardless how the garment is handled (folded). Also, common devices could be designed with radical shapes and dimensions as the limitations imposed by planar circuit boards are overcome.

The extremely low device packaging volume of the circuit structures of the present invention would substantially reduce the weight and size of electronic devices.

BRIEF DESCRIPTION OF THE DRAWINGS

FIG. 5 shows a comparison of environmental aging data for the thin circuit package of the present invention (50 $\mu$m) (FIG. 5A), and for an identical package with a chip of standard thickness (500 $\mu$m) (FIG. 5B);

DETAILED DESCRIPTION OF THE INVENTION

Figure 1:
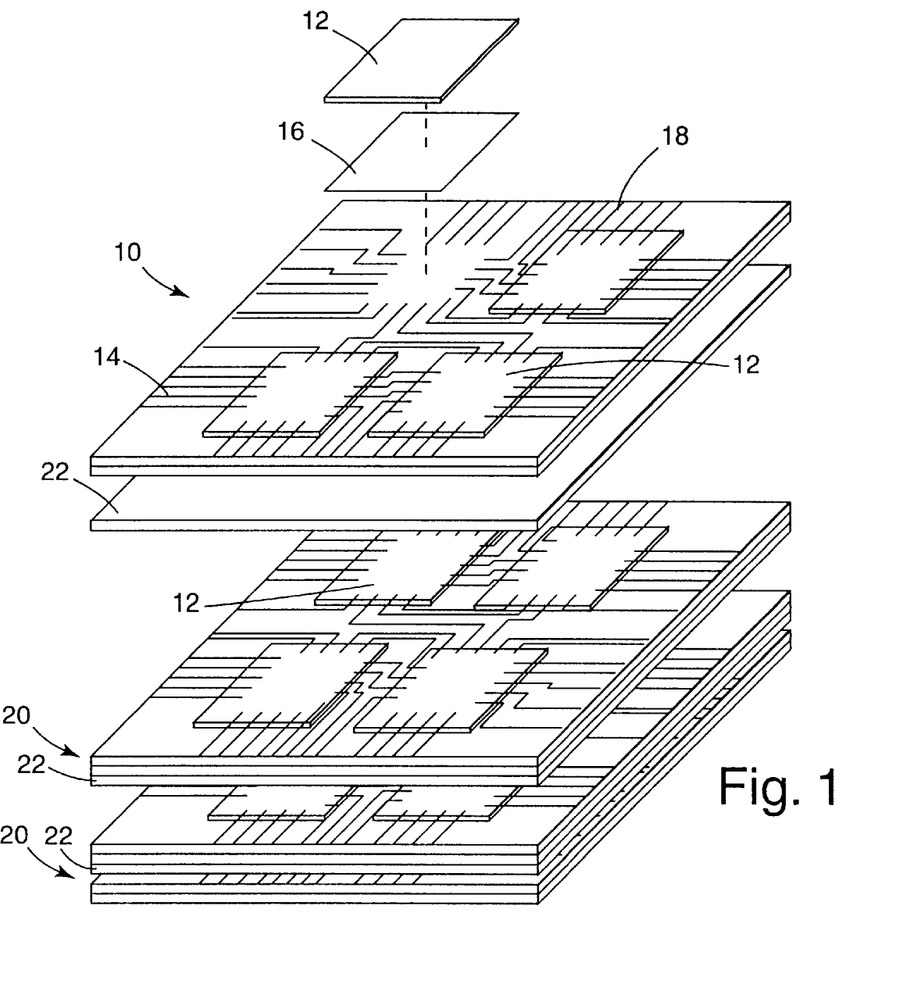
FIG. 1 is a schematic, exploded, perspective view of a circuit package of the present invention. The circuit package is shown incorporated into a multi-layered electronic package.

Referring to FIG. 1, the present invention is a circuit package 10 that combines a thinned active semiconductor component 12 mounted on a flexible substrate 14 using an adhesive layer 16. The circuit package 10 is typically between about 0.001 inch and about 0.015 inch (25 $\mu$m and 380 $\mu$m) thick, preferably between 0.002 inch and 0.011 inch (50 $\mu$m and 280 $\mu$m) thick.

The thinned semiconductor component 12 has been processed to reduce its thickness to less than about 100 $\mu$m, preferably less than about 50 $\mu$m, most preferably less than about 20 $\mu$m. The electronic component 12 is bonded face down to the flexible substrate 14.

The electronic component 12 is bonded to the substrate 14 with a thin layer of an adhesive 16. The adhesive layer 16 may be applied on the underside of the electronic component 12, and bonding pads (such as, for example, gold bumps) on the underside of the semiconductor component (not shown in FIG. 1) may push through the adhesive layer 16 to make contact with conductive circuit traces 18 on the circuit substrate 14. If the electronic component 12 has no additional metal on the chip bonding pads, the adhesive layer may be loaded with conductive particles. The conductive particles may be either by randomly dispersed through the adhesive film or placed in a patterned arrangement. Typically, the thin adhesive layer is less than about 50 $\mu$m thick, preferably less than about 25 $\mu$m thick, most preferably about 2–15 $\mu$m thick. This very thin adhesive layer offers mechanical and thermal benefits (low bond-line stress, minimal thermal expansion throughout the operating temperature, and increased heat transfer through the thin adhesive layer) that lead to improved interconnect reliability.

Examples of suitable adhesive layers include catalytic adhesive systems described in U.S. Pat. No. 5,620,795 to Haak et al., which is incorporated herein by reference. The adhesive system may optionally include a coupling agent to improve adhesion to the surface of the electronic component, such as, for example, the agent described in U.S. Pat. No. 5,143,785, to Pujol et al., which is incorporated herein by reference. Suitable particles include, for example, gold coated nickel particles.

The flexible substrate 14 may include any suitable circuit board material or polymeric material. Preferred substrate materials include polyimides such as those available under the trade designation Kapton from E.I. Du Pont de Nemours, Inc., Wilmington, Del., USA. The flexible substrate 14 further includes a conductive circuit structure that will be electrically interconnected to bonding sites on the semiconductor component.

An optional protective coating (not shown in FIG. 1) may be applied to the circuit packages 10 to prevent contamination and to protect the integrated circuit chip.

Figure 2:
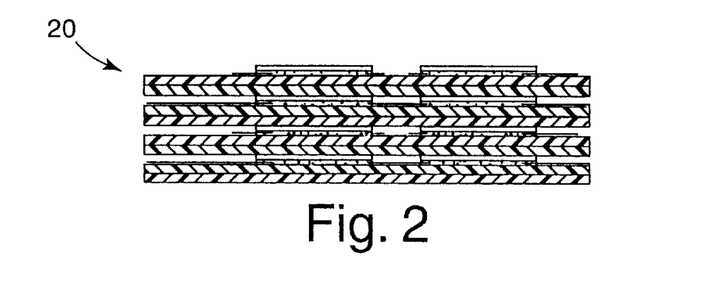
FIG. 2 is a schematic, cross sectional view of a multi-layered electronic package of the present invention.

As further illustrated in FIG. 1 and FIG. 2, at least two of the circuit packages 10 of the present invention may be laminated to one another to provide a multi-layered, three dimensional electronic package 20. The circuit packages 10 may be laminated together using a layer of a laminating adhesive 22, and may be electrically interconnected with one another using, for example, the procedures in U.S. Pat. No. 5,601,678 to Gerber et al., which is incorporated herein by reference. The laminating adhesive 22 may be any adhesive suited to adhering the flexible substrates 14 to one another, and an adhesive such as those available under the trade designation Pyrolux LF from E.I. Du Pont de Nemours, Inc., Wilmington, Del., USA. The thickness of the laminating adhesive layer is typically about 0.5 mils (13 $\mu$m).

An optional protective coating (not shown in FIGS. 1–2) may be applied to the electronic package 20 to prevent contamination and to protect the assembled multi-chip device.

Figure 7:
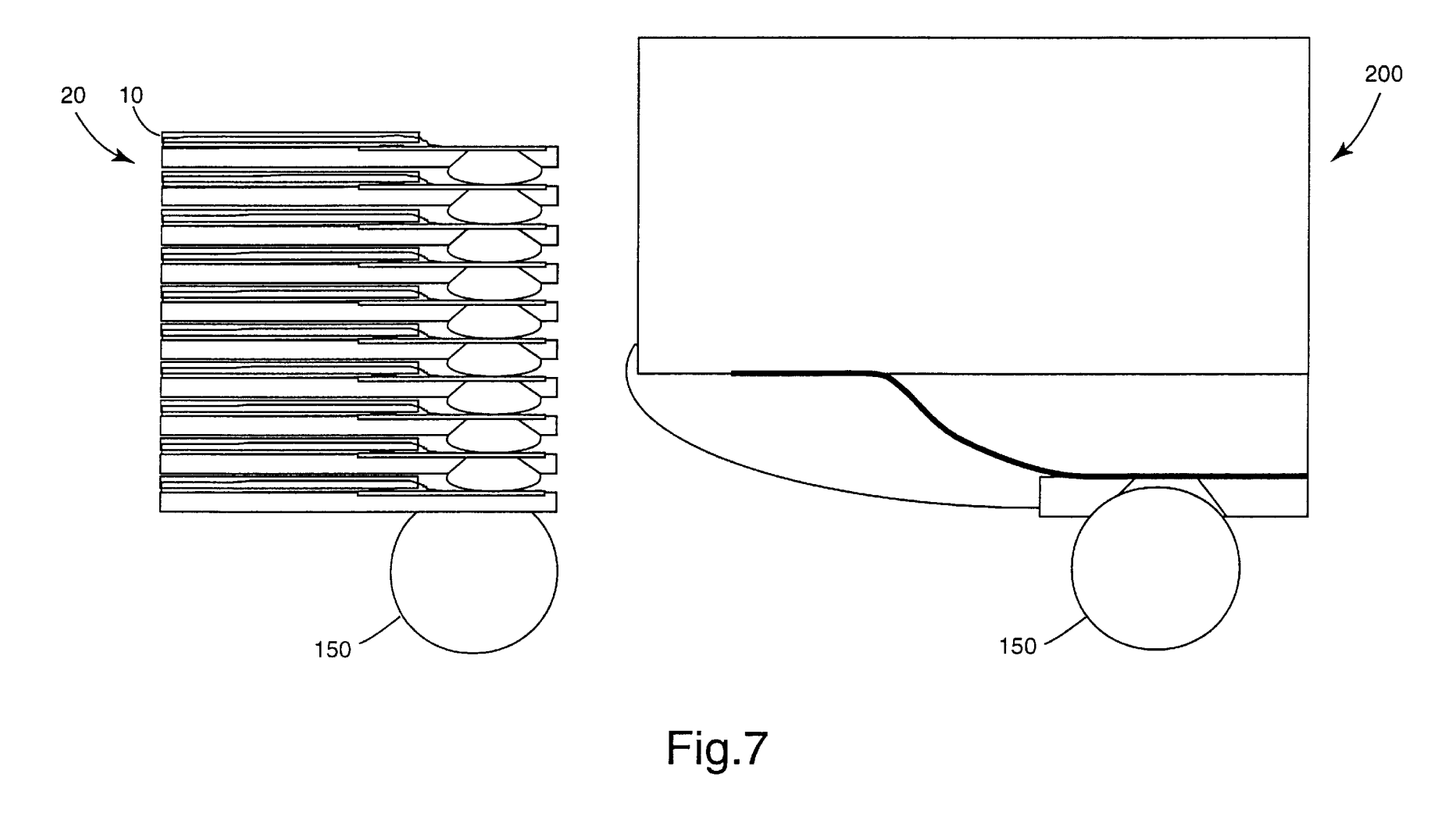
FIG. 7 is a schematic comparison of the thickness of a three dimensional electronic package of the present invention to that of a conventional chip scale package.

The multi-layered, three dimensional electronic package 20 of the present invention enable extremely high silicon packing densities. As an illustration of the dramatic packing densities possible with the present invention, on the left in FIG. 7 at 100 is an electronic package of the present invention that includes ten circuit packages 10 laminated to one another and electrically connected. On the right in FIG. 7 at 200 is a conventional package for mounting electronic devices to a printed circuit board—known in the art as a "Chip Scale Package." Each construction includes large balls 150 on its lower surface for attachment of the package to a printed circuit board (not shown in FIG. 7) by surface mount solder reflow. This drawing is approximately to scale, and shows the potential of the electronic packages of the present invention to reduce the size of electronic devices.

Figure 3A:
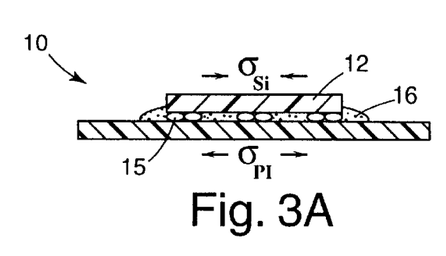
FIG. 3A is a schematic representation of state of stress after bonding in a multi-layered electronic package of the present invention.
Figure 3B:
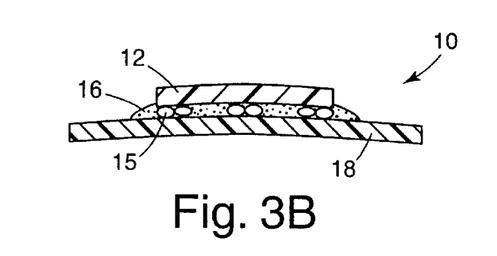
FIG. 3B is a schematic representation of state of stress after relaxation in a multi-layered electronic package of the present invention.

The overall thinness of the circuit packages 10 and electronic packages 20 of the present invention reduce stress that may be introduced into the packages during the bonding process (See FIG. 3A). After cool-down from bonding temperature, the thermal expansion mismatch among the circuit substrate 14, adhesive layer 16, and thinned silicon in the electronic device 12 lead to tensile stresses at the circuit substrate surface ($\sigma_{PI}$) and along the edge of the adhesive (near the interconnect pads), as well as compressive stress on the silicon surface ($\sigma_{Si}$) Delamination or cracks in the adhesive 16 can arise in a circuit package 10 with full silicon thickness that retains the stress. These flaws can propagate through the interconnect pads 15 on the electronic device 12, leading to device failure. This stress is overcome with flexible silicon as the tensile force imparts a slight curvature to the circuit package 10 (See FIG. 3B). Due to the flexibility of the thin chip the entire flip-chip package can bend to relax the tensile and compressive stress remaining in the bond due to thermal expansion mismatch. A low or no stress adhesive flip-chip bond will have substantially reduced tendency to fail.

The present invention will now be more fully described with reference to the following non-limiting examples.

EXAMPLES

EXAMPLE 1

A two-dimensional arrangement of chips (a multiple thin-chip-on-flex module).

A test chip (D-120 XA) silicon wafer was obtained from Minnesota Mining and Manufacturing Co., (3M), St. Paul, Minn., USA. The test chip was 0.260 inch (6.6 mm) square with 40 four-wire Kelvin electrical interconnect test structures having 4 mil×15 mil (100 µm×380 µm) or 4 mil×10 mil (100 µm×250 µm) aluminum pads. The wafer was thinned to 50 µm thick at the United States Department of Defense Microelectronic Research Laboratory (MRL).

An adhesive made with a thermoset/thermoplastic blend cast from solvent was used as the adhesive layer. The adhesive was selected for adhesion to the flexible substrate surface, and included a catalytic additive for fast cure and a coupling agent for improved adhesion to the chip surface (SiN). The adhesive was patterned with 8 µm gold coated nickel particles in a 500 dot per inch grid.

Laminated flex circuits were prepared by first roll laminating an inter-layer laminating adhesive to a thickness of about 12 µm. The laminating adhesive was obtained from E. I. Du Pont de Nemours, Wilmington, Del., USA under the trade designation Pyralux LF. The laminating adhesive layer was applied to the back-side of a layer of polyimide flex circuit material available from 3M, St. Paul, Minn., USA using 280° F. (140° C.), 80 psi (550 Pa), and 1 foot (31 cm) per minute processing conditions. The layer-to-layer lamination was completed using 400° F. (200° C.), 200 psi (1400 Pa), and 1 hour followed by cooling under pressure.

An adhesive layer was pre-attached to two-layer laminate flex by first wetting the adhesive against the flex set on a 60° C. hot plate. The adhesive layer was pressed uniformly over the entire area by rubbing with a cotton-tipped applicator. The adhesive release liner was then peeled away and discarded after the flex was cooled again to ambient.

The thinned chip was placed on a larger piece of non-stick material (available from DuPont, Wilmington, Del., USA under the trade designation Teflon). The non-stick material was placed on a manual flip-chip bonder thermode. The nonstick layer of Teflon was 35–40 µm thick and a narrow slit for vacuum hold-down was cut in it with a razor bladed knife. The non-stick Teflon layer was necessary to avoid contact of the adhesive to the thermode surface during bonding. A vacuum hold-down slit helped keep the chip in alignment as the force was applied.) The flex with adhesive was taped to a glass slide using removable transparent tape.

A peripheral loading element made from 12 µm thick polyimide with an appropriately sized center cut-out region (circular, about ⅛ inch (0.32 cm) diameter, or square, about ⅛ inch by ⅛ inch (0.32 cm by 0.32 cm)), was placed behind the flex with the cut-out region centered on the bond area. The flex taped to glass was set in the bonder upper position and held in place by vacuum hold-up. A look-up/look-down camera lens was introduced between the thin chip and flex and the respective pads were brought into precise alignment by adjusting planar and angular positioning controls. The camera lens was removed from between the thin chip and flex. The thermode was then raised so that the thin chip was brought into contact with the flex at 30 lbs (14 kg) force. The thermode temperature was raised to 90° C. setpoint (65° C. actual adhesive temperature) and held for 90 sec. The thermode was then cooled to below 50° C. The thermode temperature was next raised to over 240° C. setpoint (200° C. actual temperature) and held for an additional 90 sec at which point the pressure was removed. The thin chip bonded to the flex was removed from the glass slide.

Figure 4:
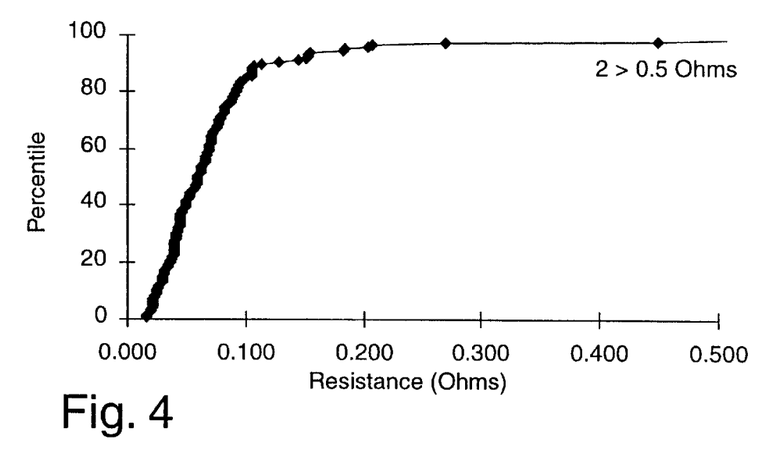
FIG. 4 shows the electrical contact performance of the thin chip-on-laminate flex package made according to the procedure Example 1.

The graph in FIG. 4 shows the electrical contact performance of the thin chip-on-laminate flex package made according to the procedure in this example. The graph includes data from four bonded samples and indicates acceptable interconnection reliability.

Figure 5A:
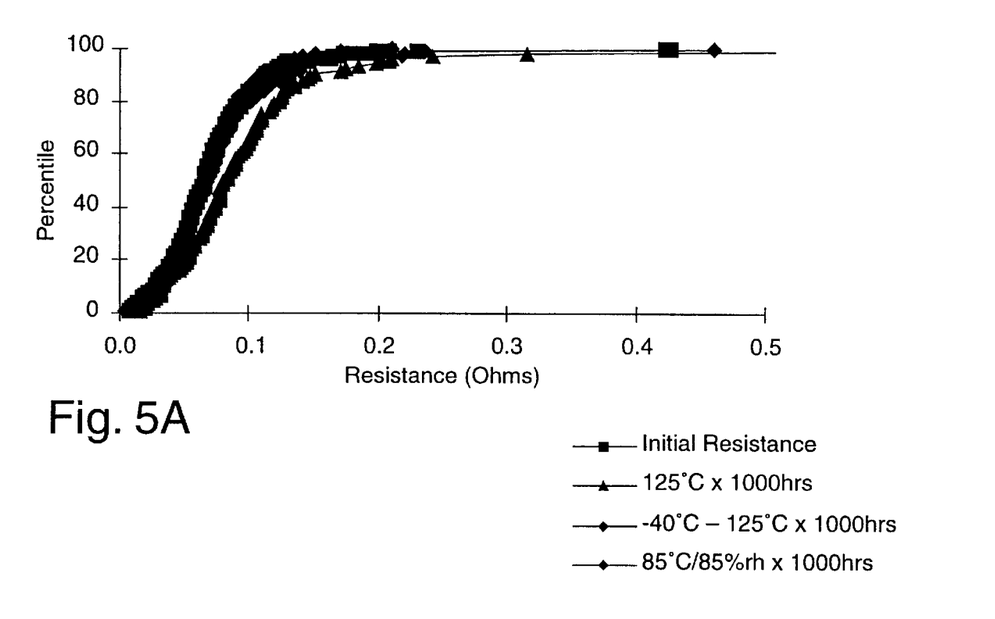
Figure 5B:
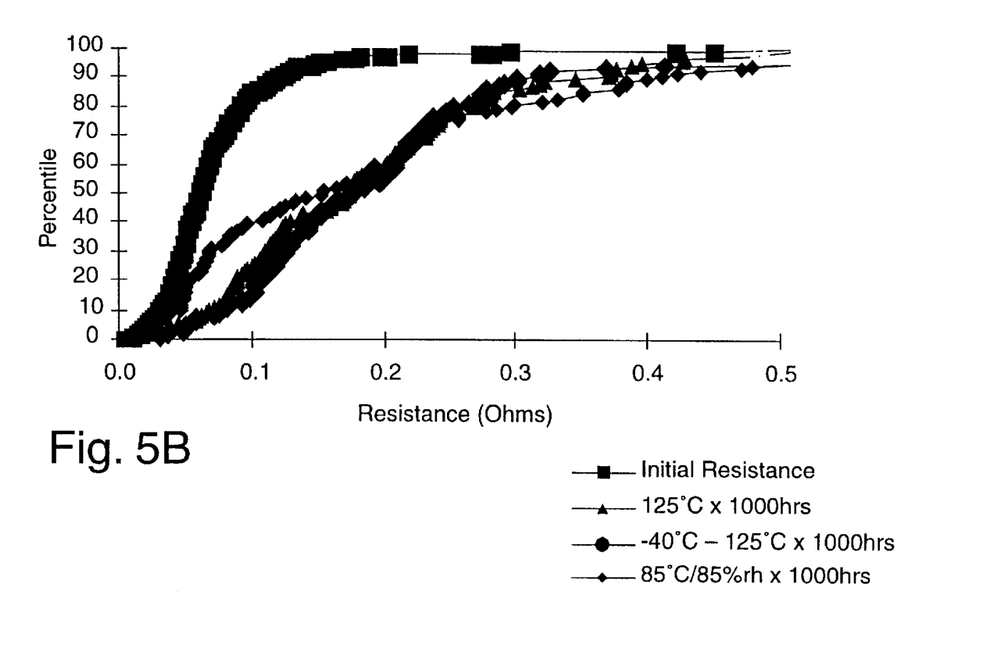

Environmental aging tests were also performed on these samples. The graphs in FIG. 5 show a comparison of environmental aging data for the thin circuit package of the present invention (50 µm) (FIG. 5A), and for an identical package with a chip of standard thickness (500 µm) (FIG. 5B). The data in FIG. 5A show lower and more stable interconnect resistance than the data in FIG. 5B. This indicates that the flexibility of the thin chips may allow increased conformance to the substrate during the bonding step, so that each pad receives about the same bonding force, even if the surfaces or stack thicknesses are somewhat non-uniform. Also, the inherent flexibility in the package reduces stress in the bond line after bonding. These factors could result in a higher-yield bonding process with more uniform bonds at the electrical contact points.

Numerous chips can be added to a single flex giving a multi-chip structure. This represents a multiple thin-chip-on-flex module example. Next, an additional module was stacked to prepare a three dimensional package.

EXAMPLE 2

A three dimensional package.

An additional multiple thin-chip-on-flex module was prepared as detailed in example 1.

Stacked laminated flex circuits were prepared by first roll laminating the inter-layer laminating adhesive (50 µm Pyralux) to the back-side of the top layer 2D multi-chip-on-laminate flex using 280° F. (140° C.), 80 psi (550 Pa), and 1 foot (30 cm) per minute. Next, the two 2D multi-chip-on-laminate flex layers are electrically connected by edge bonding using a hot bar bonder with 4 kgf/sq. cm, 250° C., and 2 minutes. Then the 2D layer-to-2D layer full area lamination is completed using 400® F. (200 ° C.), 200 psi (1400 Pa), and 1 hour followed by cooling under pressure following the set-up conditions explained above.

Figure 6A:
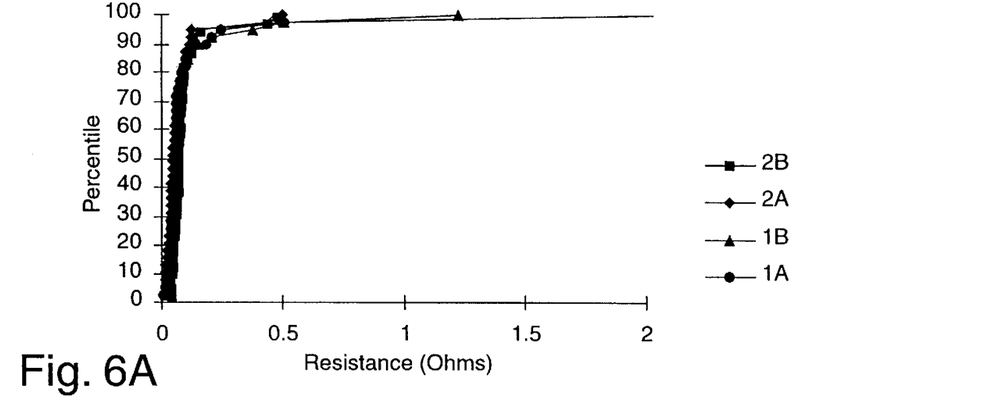
FIG. 6 shows the electrical contact performance of the thin circuit package of the present invention both before and after the 2D multi-chip laminate structures were stacked and laminated into a 3D multi-chip electronic circuit structure.
Figure 6B:
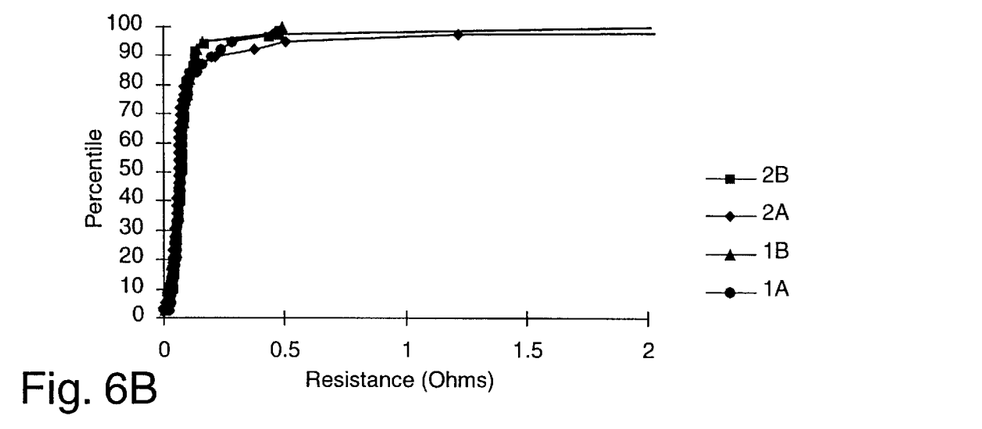
Figure 6C:
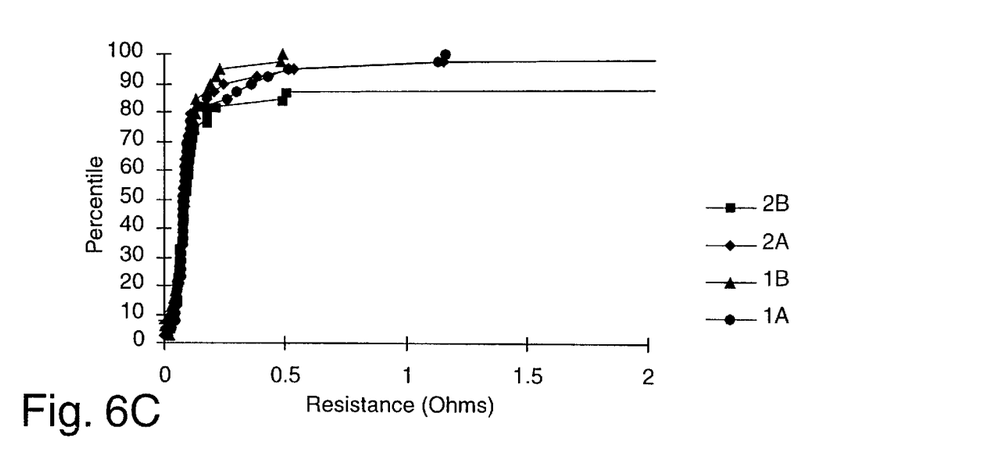

The data in FIG. 6 show the electrical contact performance of the thin chip-on-flex package both before and after the 2D multi-chip laminate structures were stacked and laminated into a 3D multi-chip structure. The as-bonded thin chip-on-laminate flex data demonstrates the performance that is achievable for a 2D thin chip-on-flex structure. All four chips initially gave 100% yield interconnect values (one reading on chip 1A was slightly higher than 2Ω). After roll lamination and edge bonding to connect the 2D layers one reading on 2D layer 2 was open owing to a minor misalignment of the edge pads and the originally high reading on chip 1A remained higher than 2Ω. This represents a possible rendition of a functional 3D structure with 2D layer-to-2D layer connection made with hot bar bonding but without full lamination over the entire area. The sample was fully laminated to bond the entire area together. Several readings were open after this lamination step. However, these were all due to failure of the edge bond connecting the top and bottom 2D layers not due to chip fracture or adhesive bond-line degradation.

The open readings found after full area lamination occurred at the edge bond connection between the 2D layers. The edge bond connects the pads using the laminating adhesive to maintain contact. This bond does not fully cure the laminating adhesive around the 2D layer-to-2D layer contact pads. The laminating adhesive is subsequent pressed during the full area lamination. This edge bond evidently suffers relaxation during the long lamination cycle weakening the 2D layer-to-2D layer contact. This drawback could be overcome by replacing the laminating adhesive with a suitable flex-to-flex z-axis adhesive material that would fully cure during the edge bond and would resist relaxation during the full area lamination.

What is claimed is:

1. A circuit package comprising:

a semiconductor device with a thickness of less than about 100 μm;

a flexible circuit substrate with a conductive circuit thereon; and an adhesive layer with a thickness of less than about 25 μm between the semiconductor device and the circuit substrate, wherein the semiconductor device is electrically connected to the circuit in the substrate, the circuit package is less than about 275 μm thick, and the circuit package remains flexible after assembly.

2. A circuit package as claimed in claim 1, wherein the adhesive layer is loaded with randomly dispersed conductive particles.

3. A circuit package as claimed in claim 1, wherein the adhesive layer is loaded with conductive particles, and the particles are placed in a patterned arrangement.

4. An electronic package comprising:

a first circuit package comprising a semiconductor device with a thickness of less than about 100 μm;

a flexible circuit substrate with a conductive circuit trace thereon;

an adhesive layer with a thickness of less than about 25 μm between the semiconductor device and the circuit substrate, wherein the semiconductor device is electrically connected to the circuit trace, and first circuit package is less than about 275 μm thick;

a second circuit package comprising a semiconductor device with a thickness of less than about 100 μm;

a flexible circuit substrate with a conductive circuit trace thereon;

an adhesive layer with a thickness of less than about 25 μm between the electronic device and the circuit substrate, wherein the semiconductor device is electrically connected to the circuit trace and the second circuit package is less than about 275 μm thick; and a laminating adhesive between the first circuit package and the second circuit package, wherein the first and second circuit packages are electrically connected to one another, and the electronic package remains flexible after assembly.

5. The electronic package of claim 4, wherein the first and second circuit packages are laminated together by bonding a single edge of the first and second circuit packages.

6. The electronic package of claim 4, wherein the entire mating surfaces of the first and second circuit packages are laminated together.

7. A circuit package comprising:

a semiconductor device with a thickness of less than about 100 μm;

a flexible circuit substrate with a conductive circuit thereon; and an adhesive layer with a thickness of less than about 25 μm between the semiconductor device and the circuit substrate, wherein the semiconductor device is electrically connected to the circuit in the substrate, the circuit package is less than about 275 μm thick, and the circuit package remains flexible after assembly; and wherein the semiconductor device is exposed on the surface of the substrate.

* * * * *

UNITED STATES PATENT AND TRADEMARK OFFICE
CERTIFICATE OF CORRECTION

PATENT NO.      : 6,246,010 B1
DATED           : June 12, 2001
INVENTOR(S)     : Zenner, Robert L. D.

It is certified that error appears in the above-identified patent and that said Letters Patent is hereby corrected as shown below:

Column 1,
Line 67, "chips (501 μm" should read -- chips (50 μm --.

Column 6,
Line 60, "using 400 ® F." should read -- using 400ºF. --.

Signed and Sealed this

Sixteenth Day of July, 2002

Attest:

JAMES E. ROGAN
Attesting Officer    Director of the United States Patent and Trademark Office